(12) United States Patent
Wada et al.

(10) Patent No.: US 8,575,834 B2
(45) Date of Patent: Nov. 5, 2013

(54) GLASS FOR DIFFUSION LAYER IN ORGANIC LED ELEMENT, AND ORGANIC LED ELEMENT UTILIZING SAME

(75) Inventors: Naoya Wada, Tokyo (JP); Nobuhiro Nakamura, Tokyo (JP)

(73) Assignee: Asahi Glass Company, Limited, Tokyo (JP)

( * ) Notice: Subject to any disclaimer, the term of this patent is extended or adjusted under 35 U.S.C. 154(b) by 0 days.

(21) Appl. No.: 13/447,014

(22) Filed: Apr. 13, 2012

(65) Prior Publication Data

US 2012/0194064 A1    Aug. 2, 2012

Related U.S. Application Data

(63) Continuation of application No. PCT/JP2010/067985, filed on Oct. 13, 2010.

(30) Foreign Application Priority Data

Oct. 15, 2009  (JP) .................................. 2009-238676
Apr. 30, 2010  (JP) .................................. 2010-105715

(51) Int. Cl.
  *H01L 51/52*    (2006.01)
(52) U.S. Cl.
  USPC ........................................ 313/504; 313/498
(58) Field of Classification Search
  USPC ................................................ 313/498–512
  See application file for complete search history.

(56) References Cited

U.S. PATENT DOCUMENTS

| | | | | |
|---|---|---|---|---|
| 6,661,029 | B1 * | 12/2003 | Duggal | 257/89 |
| 7,667,223 | B2 * | 2/2010 | Suehiro et al. | 257/10 |
| 2008/0169758 | A1 * | 7/2008 | Cok | 313/506 |
| 2009/0153972 | A1 | 6/2009 | Nakamura | |

FOREIGN PATENT DOCUMENTS

| | | |
|---|---|---|
| JP | 2007-246382 | 9/2007 |
| JP | 2008-030994 | 2/2008 |
| JP | 4059695 | 3/2008 |
| JP | 2009-149521 | 7/2009 |
| WO | WO-2006/118326 A1 | 11/2006 |
| WO | WO-2009/017035 A1 | 2/2009 |

OTHER PUBLICATIONS

International Search Report in PCT/JP2010/067985 dated Dec. 21, 2010.

* cited by examiner

*Primary Examiner* — Nimeshkumar Patel
*Assistant Examiner* — Donald Raleigh
(74) *Attorney, Agent, or Firm* — Foley & Lardner LLP (57) ABSTRACT

The present invention relates to a glass for a scattering layer of an organic LED element, which contains, in terms of mol % on the basis of oxides, 0~20% of $P_2O_5$, 15~60% of $B_2O_3$, 15~28% of $Bi_2O_3$ and 20~50% of ZnO, in which a value obtained by dividing the content of $P_2O_5$ by the content of ZnO is less than 0.48, the sum of the contents of $P_2O_5$ and $B_2O_3$ is 30~60%, the content of $P_2O_5$ is 10% or less when the sum of the contents of $P_2O_5$ and $B_2O_3$ exceeds 50%, and the glass does not substantially contain lead (PbO or $Pb_3O_4$), $Li_2O$, $Na_2O$ and $K_2O$, except for those contained as impurities.

11 Claims, 1 Drawing Sheet

GLASS FOR DIFFUSION LAYER IN ORGANIC LED ELEMENT, AND ORGANIC LED ELEMENT UTILIZING SAME

TECHNICAL FIELD

The present invention relates to a glass for scattering layer of an organic LED element, and an organic LED element utilizing the same.

BACKGROUND ART

It has been known in the related art to provide a scattering layer in an organic LED element in order to improve light extraction efficiency of an organic LED element (for example, see Patent Document 1).

The scattering layer described in Patent Document 1, is formed by dispersing a scattering material in a base material. Glass that does not contain alkali metal is exemplified as the base material.

Optical glass containing $P_2O_5$, $Bi_2O_3$ and ZnO and having a high refractive index, a low-temperature softening property, and a low thermal expansion rate has been known (for example, see Patent Document 2).

BACKGROUND ART DOCUMENT

Patent Documents

Patent Document 1: WO 09/017,035 pamphlet
Patent Document 2: Japanese Patent No. 4059695

SUMMARY OF THE INVENTION

Problems that the Invention is to Solve

However, the glass for a scattering layer described in Table 12 of Patent Document 1 contains much lead ($Pb_3O_4$). Therefore, it was difficult to satisfy the user's demand for reducing the use amount of lead as small as possible.

Patent Document 2 does not describe the use of the glass for a scattering layer of an organic LED element. Further, the glass described in Patent Document 2 has a problem in that the glass frit is easily crystallized when being fired. Light transmittance is reduced and flatness and smoothness of the glass surface is deteriorated by the crystallization, such that a short may be generated between the electrodes of the organic LED element. "Crystallization" means crystallization when the glass frit is fired in the following description.

The present invention has been made in consideration of the problems and has an object to provide a glass for a scattering layer of an organic LED element that can satisfy the user's demand for reducing the use amount of lead without being easily crystallized, and an organic LED element using the glass.

Means for Solving the Problems

In order to solve the above-mentioned problems, a glass for a scattering layer of an organic LED element of the present invention, contains, in terms of mol % on the basis of oxides, 0~20% of $P_2O_5$, 15~60% of $B_2O_3$, 15~28% of $Bi_2O_3$ and 20~50% of ZnO,
wherein a value obtained by dividing the content of $P_2O_5$ by the content of ZnO is less than 0.48,
the sum of the contents of $P_2O_5$ and $B_2O_3$ is 30~60%,
the content of $P_2O_5$ is 10% or less when the sum of the contents of $P_2O_5$ and $B_2O_3$ exceeds 50%, and the glass does not substantially contain lead (PbO or $Pb_3O_4$), $Li_2O$, $Na_2O$ and $K_2O$, except for those contained as impurities.

Also, other glass for a scattering layer of an organic LED element of the present invention, contains, in terms of mol % on the basis of oxides, 0~20% of $P_2O_5$, 15~60% of $B_2O_3$, 10~37% of $Bi_2O_3$, 5~50% of ZnO, 0~20% of $SiO_2$, 0~10% of $Al_2O_3$, 0~5% of $ZrO_2$, 0~10% of $Gd_2O_3$, 0~15% of $TiO_2$, and 0~10% of the total of MgO, CaO, SrO and BaO,
wherein a value obtained by dividing the content of $P_2O_5$ by the content of ZnO is less than 0.48,
the sum of the contents of $P_2O_5$ and $B_2O_3$ is 30~60%,
the content of $P_2O_5$ is 10% or less when the sum of the contents of $P_2O_5$ and $B_2O_3$ exceeds 50%, and
the glass does not substantially contain lead (PbO or $Pb_3O_4$), $Li_2O$, $Na_2O$ and $K_2O$, except for those contained as impurities.

An organic LED element of the present invention sequentially comprises:
a substrate;
a scattering layer;
a first electrode;
an organic layer; and
a second electrode,
wherein the scattering layer comprises a base material and one or more kinds of scattering materials being dispersed in the base material and having a different refractive index from the base material, and
the base material comprises a glass containing, in terms of mol % on the basis of oxides, 0~20% of $P_2O_5$, 15~60% of $B_2O_3$, 15~28% of $Bi_2O_3$, and 20~50% of ZnO, in which a value obtained by dividing the content of $P_2O_5$ by the content of ZnO is less than 0.48, the sum of the contents of $P_2O_5$ and $B_2O_3$ is 30~60%, the content of $P_2O_5$ is 10% or less when the sum of the contents of $P_2O_5$ and $B_2O_3$ exceeds 50%, and the glass does not substantially contain lead (PbO or $Pb_3O_4$), $Li_2O$, $Na_2O$ and $K_2O$, except for those contained as impurities.

Additionally, other organic LED element of the present invention sequentially comprises:
a substrate;
a scattering layer;
a first electrode;
an organic layer; and
a second electrode,
wherein the scattering layer comprises a base material and one or more kinds of scattering materials being dispersed in the base material and having a different refractive index from the base material, and
the base material contains, in terms of mol % on the basis of oxides, 0~20% of $P_2O_5$, 15~60% of $B_2O_3$, 10~37% of $Bi_2O_3$, 5~50% of ZnO, 0~20% of $SiO_2$, 0~10% of $Al_2O_3$, 0~5% of $ZrO_2$, 0~10% of $Gd_2O_3$, 0~15% of $TiO_2$ and 0~10% of the total of MgO, CaO, SrO and BaO, in which a value obtained by dividing the content of $P_2O_5$ by the content of ZnO is less than 0.48, the sum of the contents of $P_2O_5$ and $B_2O_3$ is 30~60%, the content of $P_2O_5$ is 10% or less when the sum of the contents of $P_2O_5$ and $B_2O_3$ exceeds 50%, and the base material does not substantially contain lead (PbO or $Pb_3O_4$), $Li_2O$, $Na_2O$ and $K_2O$, except for those contained as impurities.

Advantage of the Invention

According to the present invention, it is possible to provide a glass for a scattering layer of an organic LED element that can satisfy the user's demand for reducing the use amount of lead without being easily crystallized, and an organic LED element using the glass.

MODE FOR CARRYING OUT THE INVENTION

Embodiments of the present invention are described hereafter with reference to the drawings. The following embodiments are provided as examples and may be modified in various ways without departing from the scope of the present invention.

Figure 1:
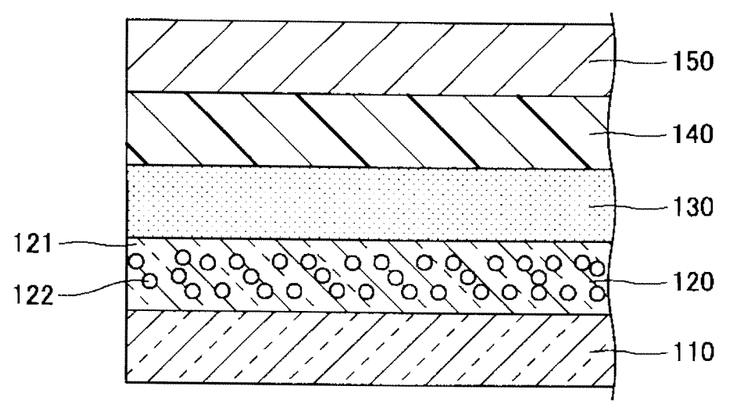
FIG. 1 is a cross-sectional view showing an example of an organic LED element of the present invention.

FIG. 1 is a cross-sectional view showing an example of an organic LED element of the present invention.

In the example shown in FIG. 1, an organic LED element is a bottom emission type organic LED element and includes, sequentially, a substrate 110, a scattering layer 120, a first electrode 130, an organic layer, 140 and a second electrode 150. The first electrode 130 is a transparent electrode (anode) and has a transparency for transmitting light emitted from the organic layer 140 to the scattering layer 120. The second electrode 150 is a reflective electrode (cathode) and has reflectivity for reflecting the light emitted from the organic layer 140 to return the light to the organic layer 140.

In the example shown in FIG. 1, although the first electrode 130 is an anode and the second electrode 150 is a cathode, the first electrode 130 may be a cathode and the second electrode 150 may be an anode.

(Substrate)

The substrate 110 has translucency. The substrate 110 (hereafter, referred to as a "translucent substrate 110") comprises a material having high transmittance for the visible light, for example, glass or plastic.

As the glass for the translucent substrate 110, alkali glass, non-alkali glass and quartz glass may be mentioned. In general, soda-lime glass is used. Common soda-lime glass has an average linear expansion coefficient of about $87 \times 10^{-7}$/° C. at 50~300° C. (hereafter, simply referred to as an "average linear expansion coefficient") and an annealing point of about 550° C. The translucent substrate 110 comprising the soda-lime glass may be deformed by heat treatment at a temperature of 550° C. or more, such that it is preferable to form the scattering layer 120 and the like at a temperature less than 550° C.

When the translucent substrate 110 is a plastic substrate, the plastic substrate may be provided with a barrier, because the moisture resistance of the plastic substrate is lower than that of the glass substrate. For example, the translucent substrate 110 may be implemented by further forming a separate glass layer at the opposite side to the scattering layer 120 on the plastic substrate.

The translucent substrate 110 generally has a thickness of 0.1 mm-2.0 mm. When the glass substrate that is the translucent substrate 110 is thin, strength may be insufficient. It is preferable that the glass substrate that is the translucent substrate 110 has a thickness of 0.5 mm~1.0 mm.

The scattering layer 120 is formed on the translucent substrate 110. Surface treatment, such as silica coating, may be applied to the scattering layer-forming surface on the glass substrate that is the translucent substrate 110. That is, a protective layer, such as a silica film, may be formed between the scattering layer 120 and the glass substrate that is the translucent substrate 110.

(First Electrode)

The first electrode (anode) 130 requires 80% or more of translucency to extract light generated from the organic layer 140. Additionally, in order to inject many holes, high work function is required. In detail, materials, such as ITO (Indium Tin Oxide), $SnO_2$, ZnO, IZO (Indium Zinc Oxide), AZO (ZnO—$Al_2O_3$: zinc oxide doped with aluminum), GZO (ZnO—$Ga_2O_3$: zinc oxide doped with gallium), Nb-doped $TiO_2$, and Ta-doped $TiO_2$, are used.

It is preferable that the first electrode 130 has a thickness of 100 nm or more. On the other hand, when the thickness is less than 100 nm, electric resistance increases.

The refractive index of the first electrode 130 is generally 1.9~2.2. It may be possible to increase the carrier concentration of ITO in order to reduce the refractive index of ITO, which is the first electrode 130. In detail, it is possible to decrease the refractive index of ITO by increasing the concentration of Sn in ITO. However, when the concentration of Sn increases, mobility and transmittance decrease, such that it is necessary to determine the concentration of Sn by taking balance of the properties.

The first electrode 130 may be a single layer or a plurality of layers.

The organic layer 140 is formed on the first electrode 130.

(Organic Layer)

The organic layer 140 is a layer having a light emission function and composed of a hole injection layer, a hole transport layer, a light emission layer, an electron transport layer, and an electron injection layer.

The hole injection layer requires a low difference in ionization potential in order to reduce a hole injection barrier from both electrodes. The driving voltage of the element is decreased and the injection efficiency of charge is increased by improving the injection efficiency of charge from the electrode interface in the hole injection layer. Polyethylene dioxythiophene (PEDOT:PSS) doped with polystyrene sulfonic acid (PSS) is widely used for a macromolecule and phthalocyanine-based copper phthalocyanine (CuPc) is widely used for a low molecule.

The hole transport layer transports holes injected from the hole injection layer to the light emission layer. The hole transport layer is required to have appropriate ionization potential and hole mobility. The hole transport layer, in detail, may be made of triphenylamine derivative, N,N'-bis(1-naphtyl)-N,N'-dyphenyl-1,1'-biphenyl-4,4'-diamine (NPD), N,N'-dyphenyl-N,N'-bis[N-phenyl-N-(2-naphtyl)-4'-amino biphenyl-4-yl]-1,1'-biphenyl-4,4'-diamine (NPTE), 1,1-bis(dy-4-tolylamine)phenyl]cyclohexane (HTM2), and N,N-dyphenyl-N,N-bis(3-methylephenyl)-1,1'-dyphenyl-4,4'-diamine (TPD), or the like. It is preferable that the hole transport layer has a thickness of 10 nm~150 nm. As the less the thickness, the more the voltage can be reduced, but it is preferable that the thickness is 10 nm~150 nm because of a short between electrodes.

The light emission layer provides a place where the injected electrons and holes are recombined, and is made of a material having high emission efficiency. In detail, the emission host material and the doping material of an emission coloring material that are used for the light emission layer function as the center of recombination of the holes and electrodes injected from the anode and the cathode. Further, doping the host material with an emission color material in the light emission layer achieves high emission efficiency and changes the emission wavelength. The materials are required to have an appropriate energy level for charge injection and high chemical stability or heat resistance, and to form a uniform amorphous thin film. It is also required that the kind of the color purity of the emission color is excellent or the emission efficiency is high. The emission material that is an organic material includes low-molecular materials and high-molecular materials. These materials are further classified into a fluorescent material and a phosphorescent material in accordance with the emission mechanism. Specifically, as the light emission layer, such as tris(8-quinolinorate) aluminum complex (Alq3), bis(8-hydroxy) quinaldine aluminum phenoxide (Alq'2OPh), bis(8-hydroxy) quinaldine aluminum-2,5-dimethly phenoxide (BAIq), mono (2,2,6,6-tetramethyl-3,5-heptanedionate) lithium complex (Liq), mono (8-quinolinorate) natrium complex (Naq), mono (2,2,6,6-tetramethyl-3,5-heptanedionate) lithium complex, mono (2,2,6,6-tetramethyl-3,5-heptanedionate) natrium complex, and bis (8-quinolinorate) calcium complex (Caq2), or a fluorescent material, such as, tetraphenylbutadiene, phenylquinacridone (QD), anthracene, perylene, and coronene may be mentioned. As the host material, quinolinorate complex is preferable, and particularly, aluminum complex with 8-quinolinol and the derivative as a ligand is preferable.

The electron transport layer transports the electrons injected from the electrode. As the electron transport layer, quinolinol aluminum complex (Alq3), oxydiazol derivative (for example, 2,5-bis(1-naphtyl)-1,3,4-oxydiazol (BND) and 2-(4-t-butylphenyl)-5-(4-biphenyl)-1,3,4-oxidiazol (PBD) or the like), triazole derivative, Bathophenanthroline derivative, silole derivative, or the like may be used.

The electron injection layer is required to increase the injection efficiency of electrons. In the electron injection layer, in detail, a layer doped with alkali metal, such as lithium (Li) or cesium (Cs), is disposed on the cathode interface.

The refractive index of the organic layer 140 is generally 1.7~1.8.

The second electrode 150 is formed on the organic layer 140.

(Second Electrode)

The second electrode (cathode) 150 requires reflectivity, such that, metal with a small work function or an alloy of the metal is used. Specifically, as the second electrode 150, alkali metal, alkali earth metal, and the metal in the third group in the periodic table may be mentioned. Of these, aluminum (Al), magnesium (Mg), silver (Ag), or alloys thereof are preferably used, since these materials are inexpensive and have high chemical stability. A stacked electrode formed by depositing Al on a co-deposited film of Al and MgAg, or a thin deposited film of LiF or $Li_2O$. In the high-molecular system, stack of calcium (Ca) or barium (Ba) and aluminum (Al) is used.

(Scattering Layer)

The scattering layer 120 is disposed between the translucent substrate 110 and the first electrode 130.

When the first electrode 130 is formed on the translucent substrate 110 without the scattering layer 120 therebetween, generally, the translucent substrate 110 is lower in refractive index than the first electrode 130, such that light that travels at a small angle into the translucent substrate 100 is totally reflected to the organic layers 140 by Snells's law. The totally reflected light is reflected again from the reflective electrode, which is the second electrode 150, and reaches again the translucent substrate 110. Since the re-incident angle to the translucent substrate 110 is not changed, the light cannot be extracted from the organic LED element.

On the contrary, in the embodiment, since the scattering layer 120 is disposed between the translucent substrate 110 and the first electrode 130, it is possible to change re-incident angle to the translucent substrate 110 and to increase light extraction efficiency of the organic LED element.

The scattering layer 120, as shown in FIG. 1, is formed by dispersing one or more kinds of scattering materials 122 having a refractive index different from the base material 121 in the base material 121.

It is preferable that the refractive index of the base material 121 is equal to or higher than the refractive index of the first electrode 130. This is because when the refractive index of the base material 121 is low, a loss is generated by total reflection at the interface between the scattering layer 120 and the first electrode 130, such that the light extraction efficiency is reduced. The refractive index of the base material 121 has only to be higher in some parts (for example, red, blue, green or the like) within the range of the emission spectrum of the organic layer 140, preferably higher throughout the entire emission spectrum range (430 nm~650 nm), and more preferably higher throughout the entire wavelength range (360 nm~830 nm) of the visual spectrum. If not specifically stated, the "refractive index" means a refractive index measured at 25° C. by d line of a He lamp (wavelength of 587.6 nm) in the following description.

It is preferable that the difference in refractive index of the base material 121 and the scattering material 122 is 0.05 or more at least at a portion of the emission spectrum range of the light emission layer. In order to achieve sufficient scattering characteristics, it is preferable that the refractive index is 0.05 or more throughout the entire emission spectrum range (430 nm~650 nm) or the entire wavelength range (360 nm~830 nm) of the visible light.

It is preferable that the scattering material 122 has a ratio of 1~85 volume % to the scattering layer 120. When the scattering material is less than 1 volume %, a sufficient scattering effect is not achieved and the light extraction efficiency is also less achieved. More preferably, the scattering material is 20 volume % or more. When the scattering material is too much than 85 volume %, the light extraction efficiency may be reduced. More preferably, the scattering material is 80 volume % or less. Further preferably, the scattering material is 30 volume % or less.

The ratio of the scattering material 122 to the scattering layer 120 means the sum of the ratios of all of scattering materials, if several kinds of scattering materials are distributed in the scattering layer 120.

Although the shape of the scattering materials 122 is not specifically limited, when the scattering materials 122 are formed in spherical shapes, it is preferable that the average of the diameter thereof is 0.1~10 μm. When the average is smaller than 0.1 μm, the scattering materials cannot sufficiently function as light scattering materials. When the average is larger than 10 μm, the scattering materials are not easily distributed uniformly throughout the scattering layer 120, such that the light extraction efficiency becomes ununiform. The scattering property reduces at the portions where the number of scattering materials 122 is relatively small. The ratio of the scattering materials 122 having the maximum length of 10 μm or more is preferably 15 volume % or less, more preferably 10 volume % or less.

The first electrode 130 is formed on the scattering layer 120. The surface roughness Ra of the first electrode-forming surface on the scattering layer 120 is preferably 30 nm or less, more preferably 10 nm or less, and particularly preferably 1 nm or less. When the surface roughness exceeds 30 nm, the flatness of the first electrode 130 or the organic layer 140 is deteriorated, and a short may be generated between the first electrode 130 and the second electrode 150. The surface roughness Ra is microscopic surface roughness, which is a value that a long wavelength cutoff value λc of a profile filter prescribed in JIS B 0601-2001 is regarded as 10 μm, and for example, is measured by an AFM (Atomic Force Microscope).

The first electrode-forming surface on the scattering layer 120 may be coated to improve the flatness thereof.

(Scattering Material in Scattering Layer)

As the scattering materials 122, bubbles or particles of materials having different refractive index from the base material 121 are used. The particles are small solid substances, and for example, glass or other ceramics. The bubbles are substances of the air or a gas. When the scattering materials 122 are bubbles, the diameter means the length of the air gap.

(Base Material in Scattering Layer)

A glass is used as the base material 121. Since the base material 121 comprises a glass, it is possible to keep the flatness and smoothness and transparency of the surface of the scattering layer 120 while increasing the dispersion property of the scattering layer 120.

The glass used for the base material 121 (hereafter, referred to as "base material glass") contains, in terms of mol % on the basis of oxides, 0~20% of $P_2O_5$, 15~60% of $B_2O_3$, 10~37% of $Bi_2O_3$, 5~50% of ZnO, 0~20% of $SiO_2$, 0~10% of $Al_2O_3$, 0~5% of $ZrO_2$, 0~10% of $Gd_2O_3$, 0~15% of $TiO_2$, and 0~10% of the total of MgO, CaO, SrO and BaO, in which the value obtained by dividing the content of $P_2O_5$ by the content of ZnO is less than 0.48, the sum of the contents of $P_2O_5$ and $B_2O_3$ is 30~60%, the content of $P_2O_5$ is 10% or less when the sum of the contents of $P_2O_5$ and $B_2O_3$ exceeds 50%, and the glass does not substantially contain lead (PbO or $Pb_3O_4$), $Li_2O$, $Na_2O$, and $K_2O$, except for those contained as impurities.

The glass composition of the base material glass is described next. The unit "%" means mol %.

$Bi_2O_3$ is a component that increases the refractive index and decreases viscosity. When the content of $Bi_2O_3$ is less than 10%, the refractive index of the scattering layer 120 is excessively lowered. When the content of $Bi_2O_3$ exceeds 37%, the average linear expansion coefficient is excessively increased, such that crystallization is easily generated in the firing process. It is preferable that the content of $Bi_2O_3$ is 15~28%.

$B_2O_3$ is a component that becomes the framework of glass. When the content thereof is less than 15%, devitrification may be easily generated at the time of forming the glass, and the glass may be easily crystallized in firing after fitting. When the content of $B_2O_3$ exceeds 60%, water resistance is reduced.

ZnO is a component that stabilizes glass, and when the content thereof is less than 5%, devitrification may easily generated and the glass transition point increases, such that it is difficult to achieve flatness and smoothness of a frit-fired film. The refractive index decreases, which is not preferable. When the content of ZnO exceeds 50%, the average linear expansion coefficient increases and devitrification may be easily generated at the time of forming the glass. The weather resistance may be deteriorated. It is preferable that the content of ZnO is 20~50%.

$SiO_2$ is an optional component that increases stability of glass and decreases the average linear expansion coefficient. It is preferable that the content of $SiO_2$ is 0~20%. When the content thereof exceeds 20%, the refractive index may be excessively decreased.

$Al_2O_3$ is an optional component that increases stability of glass. It is preferable that the content of $Al_2O_3$ is 0~10%. When the content thereof exceeds 10%, the liquidus temperature increases, such that devitrification may be generated.

$P_2O_5$ is a component that becomes the framework of glass and an optional component that improve acid resistance. It is preferable that the content of $P_2O_5$ is 0~20%. When the content exceeds 20%, devitrification may be easily generated at the time of forming the glass and the glass may be easily crystallized in firing after fitting. The refractive index also decreases. When the content of $P_2O_5$ is 0%, it is possible to prevent crystallization and to firing frit without crystallizing in a wider temperature range, which is preferable. In order to improve acid resistance, the content is more preferably 2% or more, and further preferably 5% or more.

$ZrO_2$ is a component that increases weather resistance of glass and it is preferable that the content of $ZrO_2$ is 0~5%. When the content exceeds 5%, crystallization is easily generated and the glass transition point may excessively increase.

$Gd_2O_3$ is an optional component that increases the refractive index while keeping the average linear expansion coefficient, and prevents crystallization around the softening point. It is preferable that the content of $Gd_2O_3$ is 0~10%. When the content thereof exceeds 10%, crystallization is easily generated and the glass transition point and the softening point may increase. In particular, it is preferable that the content is 2% or more in order to satisfy both of low expansion and high refractive index.

$TiO_2$ is not essential but a component that increases the refractive index and may be contained up to 15%. However, when the content thereof is too large, crystallization is easily generated and the glass transition point and the softening point may increase. It may be possible to use $WO_3$, instead of (or in addition to) $TiO_2$. It is more preferable that the sum of the contents of $TiO_2$ and $WO_3$ is 0~12%.

Alkali earth metal oxides (MgO, CaO, SrO and BaO) are optional components that decrease viscosity of glass. It is preferable that the content of the alkali earth metal oxides is 0~10%. When the content thereof exceeds 10%, the average linear expansion coefficient may increase and the refractive index may decrease. It is more preferable that the content is 7% or less.

$Li_2O$, $Na_2O$ and $K_2O$ are not substantially contained in the glass. When the alkali metal oxides are contained, the alkali components may be diffused in a heat treatment process. The alkali components may have an electrically bad influence on the element.

The fact that "the components are not substantially contained" means that the components are not positively contained, except for being contained as impurities.

PbO and $Pb_3O_4$ are not substantially contained in the glass.

The value obtained by dividing the content of $P_2O_5$ by the content of ZnO is less than 0.48. Devitrification is easily generated at 0.48 or more, such that crystallization may be easily generated. The refractive index may decrease at 0.48 or more and the glass transition point and the softening point may increase.

It is preferable that the sum of the contents of $P_2O_5$ and $B_2O_3$ is 30~60%. When the sum of the contents is less than 30%, devitrification is easily generated and crystallization is easily generated, such that stability may be influenced. On the other hand, when the sum of the contents exceeds 60%, devitrification is generally generated, crystallization is easily generated and the refractive index may decrease. When the sum of the contents of $P_2O_5$ and $B_2O_3$ exceeds 50%, it is preferable that the content of $P_2O_5$ is 10% or less. When the sum of the contents exceeds 10%, devitrification is easily generated and crystallization is easily generated.

The base material glass may contain, for example, $GeO_2$, $Nb_2O_5$, $Y_2O_3$, $Ce_2O_3$, $CeO_2$, $La_2O_3$, $TeO_2$, $SnO$, $SnO_2$, $Sb_2O_3$, $Ta_2O_5$, other than the components described above, without impairing the effect of the present invention. However, it is preferable to limit the sum of the components up to 5%. The base material glass may contain a small amount of colorants to adjust the tint. The colorant may be that known in the art, such as a transition metal oxide, a rare-earth metal oxide, or metal colloid. These colorants may be used independently or together with each other.

The characteristics of the base material glass are described next.

The refractive index $n_d$ of the base material glass is preferably 1.75 or more, more preferably 1.80 or more, and particularly preferably 1.85 or more. When the refractive index is less than 1.75, a loss due to total reflection is large and the light extraction efficiency is easily reduced, at the interface of the scattering layer 120 and the fist electrode 130.

The glass softening point Ts of the base material glass is preferably 600° C. or less, more preferably 595° C. or less, and particularly preferably 590° C. or less.

When the translucent substrate 110 comprises a soda-lime glass, the glass transition point Tg of the base material glass is preferably 500° C. or less, more preferably 495° C. or less, and particularly preferably 485° C. or less, in order to prevent thermal deformation of the translucent substrate 110.

In order to prevent crystallization, the crystallization peak temperature Tc of the base material glass is preferably 600° C. or more, more preferably 650° C. or more, and particularly preferably 700° C. or more.

In order to prevent crystallization, the difference Tc-Ts between the crystallization peak temperature Tc and the glass softening temperature Ts of the base material glass is preferably 55° C. or more, more preferably 70° C. or more, and particularly preferably 90° C. or more.

When the translucent substrate 110 is comprises a soda-lime glass, the average linear expansion coefficient α of the base material glass at 50~300° C. is preferably $60 \times 10^{-7}$/° C. or more, and more preferably $65 \times 10^{-7}$/° C. or more, in order to prevent breaking or bending of the soda-lime glass. The average linear expansion coefficient α of the base material glass at 50~300° C. is preferably $100 \times 10^{-7}$/° C. or less, and more preferably $90 \times 10^{-7}$/° C. or less.

The base material glass may be obtained by weighing raw materials, such as an oxide, phosphate, metaphosphate, carbonate, nitrate, or hydroxide, mixing the raw materials, dissolving the mixture at a temperature of 900~1400° C. with a melting pot of platinum or the like, and cooling the solution. Powder of base material glass can be obtained by pulverizing the obtained base material glass with a mortar, a ball mill, or a jet mill, and classifying the glass, if necessary. The surface of the powder of the base material glass may be modified by a surfactant or a silane coupling agent.

(Method of Manufacturing Scattering Layer)

The scattering layer 120 can be manufactured by coating glass fit on the translucent substrate 110 and firing the translucent substrate 110 with the coated glass frit.

(1) Glass Frit

The glass frit includes powder of the base material glass. The particle diameter of the powder of the base material glass is preferably 1~10 μm in view of coatability. The surface of the powder of the base material glass may be modified by a surfactant or a silane coupling agent.

The glass frit may include powder of glass having a refractive index lower than the base material glass, as the scattering materials 122, other than the powder of the base material glass.

The glass frit is preferably applied to the translucent substrate 110 as a frit paste kneaded with resin or a solvent, in view of coatability.

(2) Frit Paste

The frit paste can be obtained by mixing a glass fit with a vehicle by using a planetary mixer and uniformly dispersing the mixture with three rolls. The frit paste may be further kneaded by a kneading machine to adjust viscosity. In general, 70~80 wt % of glass frit and 20~30 wt % of vehicle are mixed.

The vehicle is a mixture of resin and a solvent and a surfactant may be further mixed therein. In detail, the vehicle can be obtained by putting resin or a surfactant into a solvent heated at 50~80° C., leaving the solvent for four or twelve hours, and filtering the solvent.

The resin is provided to keep the shape of the frit paste film after applying. In detail, the resin may be ethylcellulose, nitrocellulose, acrylic resin, acetic acid vinyl, butyral resin, melamine resin, alkyd resin, and rosin resin. Ethylcellulose or nitrocellulose is used as a base resin. Butyral resin, melamine resin, alkyd resin, and rosin resin are used as additives for improving coating film strength. The debinderizing temperature in firing is 350~400° C. for ethylcellulose and 200~300° C. for nitrocellulose.

The solvent is provided to adjust the viscosity of the frit paste while dissolving the resin. The solvent is preferably rapidly dried during drying, not being dried during coating, and the boiling point thereof is preferably 200~230° C. In detail, the solvent may be an ether-based solvent (bytylcarbitol (BC), butylcarbitol acetate (BCA), diethyleneglycoldi-n-butylether, dipropylene glycol butylether, tripropylene glycol butylether, acetic acid butyl cellosolve) an alcohol-based solvent (α-terpineol, pine oil, dowanol), an ester-based solvent (2,2,4-trimethyl-1,3-pentanediol isobutylate), a phthalic ester-based solvent (DBP (dibutylphthalate), DMP (dimethylphthalate), and DOP (dioctyl phthalate)). The solvents may be independently used or may be used together with each other to adjust viscosity, a solid ratio, and a dry speed. α-terpineol, 2,2,4-trimethyl-1,3-pentanediol isobutylate are generally used. DBP (dibutylphthalate), DMP (dimethylphthalate) and DOP (dioctyl phthalate) also function as a plasticizer.

(3) Coating

As a method of coating a frit paste onto the translucent substrate 110, screen printing doctor blade printing, die coating printing and the like are used. It may be possible to obtain a green sheet by coating and drying the frit paste on an PET film or the like, and then thermally-pressing the green sheet onto the translucent substrate 110.

When screen printing is used, it is possible to control the thickness of the frit paste film after coating by adjusting the mesh roughness of the screen plate, the thickness of the emulsion, the pressing pressure in printing, and the pressed amount of squeegee.

When doctor blade printing and die coating printing are used, as compared with when screen printing is used, it is possible to make the frit paste film thick after coating.

It is also possible to make the frit paste film thick by repeating coating and drying.

(4) Firing

A frit paste coated on the translucent plate 110 is fired. The firing includes debinderizing treatment for decomposing the resin in the glass paste and allowing it to disappear and firing treatment for sintering and softening the glass paste after the debinderizing treatment. The debinderizing temperature is 350~400° C. for ethylcellulose and 20~300° C. for nitrocellulose, and heating is performed under the atmosphere from 30 minutes to 1 hour. The firing temperature (firing process temperature) is set within the range of −40° C.~+30° C. with respect to the glass softening point Ts of the base material glass or within the range of +50° C.~+120° C. with respect to the glass transition point Tg of the base material glass. The scattering layer 120 is formed on the translucent substrate 110 by cooling the translucent substrate 110 with the coated frit paste to the room temperature after firing.

It is possible to adjust the shape and size of the bubble remaining in the scattering layer 120 by adjusting the firing temperature, the firing atmosphere, and the particle size distribution of the glass frit.

When the particles of a material having a different refractive index from the base material 121, instead of (or in addition to) the bubbles are used as the scattering material, the particles of the material are mixed with the glass frit and coated and fired on the translucent substrate 110.

EXAMPLES

The present invention is described hereafter in detail by the following examples, but the present invention is not limited to the examples.

Experiment 1

In Example 1 to Example 44, bulk type of glass was obtained by weighing each powder raw material of $H_3BO_3$, ZnO, $Bi_2O_3$, $TiO_2$, $WO_3$, $Zn(PO_3)_2$, $Li_2CO_3$, $Na_2CO_3$, $K_2CO_3$, MgO, $CaCO_3$, $SrCO_3$, $BaCO_3$, $ZrO_2$, $Gd_2O_3$, $SiO_2$, and $Al_2O_3$ such that the total was 200 g in order to obtain a glass having the composition in Tables 1 to 6, dissolving the materials at 1050° C. for Examples 1 to 25 and at 1250° C. for Examples 26 to 44, for one hour in a platinum melting pot, followed by dissolving the materials at 950° C. for Examples 1 to 25 and at 1100° C. for Examples 26 to 44 for one hour, and pouring a half the molten liquid into a carbon mold, and then flake type of glass was obtained by pouring the residue thereof between a pair of rolls. Deformation was removed by putting bulk type of glass into an electric furnace at 500° C. and decreasing the temperature to the room temperature at a speed of 100° C./hr.

Examples 1 to 22 and Examples 26 to 44 are working examples and Examples 23 to 25 are comparative examples.

For the obtained glass, whether there was devitrification in manufacturing of the bulk, whether there was devitrification in manufacturing of the flake, whether there was crystallization in frit firing, a refractive index $n_d$, a glass transition point Tg (unit: ° C.), the average linear expansion coefficient at 50~300° C. (unit: $10^{-7}$/° C.), a glass softening point Ts (unit: ° C.), a crystallization peak temperature Tc (unit: ° C.), and a peak height of the crystallization peak temperature (unit: μV)) were measured by the following measurement.

1. Devitrification in Manufacturing Bulk

"○" was given to when glass was poured into a carbon frame and a crystalline was not extracted or phase splitting was not seen with naked eyes while the glass was solidified, "Δ" was given to when a crystalline was partially extracted or phase splitting was partially seen, and "x" was given to when a crystalline was extracted or phase splitting was seen in the entire glass.

2. Devitrification in Manufacturing Flake

"○" was given to when the glass was poured between a pair of rolls and rapidly cooled and a crystalline was not extracted or phase splitting was not seen in the glass after solidification and "x" was given to when a crystalline was partially extracted or phase splitting was partially seen.

3. Refractive Index $n_d$

The bulk type of glass was polished and then measured with a measurement wavelength of 587.6 nm at 25° C., using a V-block method, with a precise refractometer KPR-2000 made by Kalnew Optical Industrial Co., Ltd.

4. Glass Transition Point Tg (unit: ° C.)

Bulk type of glass was processed into a round bar shape having a diameter of 5 mm and a length of 200 mm and measured with the temperature increase speed of 5° C./min, using thermal expansion meter TD5000SA made by Bruker AXS Inc.

5. Average Linear Expansion Coefficient α at 50~300° C. (unit: $10^{-7}$/° C.)

Bulk type of glass was processed into a round bar shape having a diameter of 5 mm and a length of 200 mm and measured with the temperature increase speed of 5° C./min, using thermal dilatometer TD5000SA made by Bruker AXS Inc. The average linear expansion coefficient α at 50° C.~300° C. can be obtained by, $\alpha = \{(L_{300}/L_{50})-1\}/(30-50)$, when the length of the glass bar at 50° C. is $L_{50}$ and the length of the glass bar at 300° C. is $L_{300}$.

6. Glass Softening Point Ts (unit: ° C.)

Flake type of glass was pulverized with an agate mortar, the thus-obtained glass powder was sifted from the particle diameter of 74 μm to 106 μm. Of these, 120 mg of the powder was put into a platinum pan, and measured with the temperature increase speed of 10° C./min with thermal TG/DTA EXSTAR6000 made by SII NanoTechnology Inc., and a temperature at a bending point on a DTA curve following softening flow shown at a side of which the temperature is higher than the glass transition point Tg was selected as the glass softening point Ts.

7. Crystallization Peak Temperature Tc (unit: ° C.)

Flake type of glass was pulverized with an agate mortar, the thus-obtained glass powder was sifted from the particle diameter of 74 μm to 106 μm. Of these, 120 mg of the powder was put into a platinum pan, and measured with the temperature increase speed of 10° C./min with thermal TG/DTA EXSTAR6000 made by SII NanoTechnology Inc., and the temperature of heating peak on a DTA curve following crystallization was selected as Tc. "-" was given to when there was no crystallization peak or a sufficiently low peak that was not detected.

8. Peak Height of Crystalline Peak Temperature (unit: μV)

Flake type of glass was pulverized with an agate mortar, the thus-obtained glass powder was sifted from the particle diameter of 74 μm to 106 μm. Of these, 120 mg of the powder was put into a platinum pan, and measured with the temperature increase speed of 10° C./min with thermal TG/DTA EXSTAR6000 made by SII NanoTechnology Inc., and the height of heating peak on a DTA curve following crystallization was read. "-" was given to when there was no crystallization peak or a sufficiently low peak that was not detected.

9. Crystallization in Frit Firing

Flake type of glass was pulverized with an agate mortar, the thus-obtained glass powder was sifted from the particle diameter of 74 μm to 106 μm. Of these, 120 mg of the powder was put into a platinum pan, and measured with the temperature increase speed of 10° C./min from the room temperature to 600° C. in an electric furnace. "○" was given to when crystalline precipitation was not seen with naked eyes in the obtained glass, while "x" was given to when a crystalline was extracted and the glass became opaque.

The results are shown in Tables 1 to 6. "N/A" was given to when a specimen for measuring physical properties could not be manufactured due to devitrification.

TABLE 1

|  | Ex. 1 | Ex. 2 | Ex. 3 | Ex. 4 | Ex. 5 | Ex. 6 | Ex. 7 |
|---|---|---|---|---|---|---|---|
| $P_2O_5$(mol %) | 17.0 | 17.7 | 18.1 | 15.9 | 7.4 | 11.4 | 12.2 |
| $B_2O_3$(mol %) | 16.2 | 16.9 | 17.3 | 21.9 | 25.8 | 20.2 | 30.6 |
| ZnO(mol %) | 46.8 | 48.6 | 43.3 | 43.6 | 46.8 | 44.4 | 37.2 |
| $Bi_2O_3$(mol %) | 20.0 | 16.8 | 21.3 | 18.6 | 20.0 | 19.0 | 20.0 |
| $TiO_2$(mol %) | — | — | — | — | — | 5.0 | — |
| $WO_3$(mol %) | — | — | — | — | — | — | — |
| $Li_2O$(mol %) | — | — | — | — | — | — | — |
| $Na_2O$(mol %) | — | — | — | — | — | — | — |
| $K_2O$(mol %) | — | — | — | — | — | — | — |
| SrO(mol %) | — | — | — | — | — | — | — |
| BaO(mol %) | — | — | — | — | — | — | — |
| $ZrO_2$(mol %) | — | — | — | — | — | — | — |
| $P_2O_5 + B_2O_3$(mol %) | 33.2 | 34.6 | 35.4 | 37.8 | 33.2 | 31.6 | 42.8 |
| $P_2O_5$(mol %)/ZnO(mol %) | 0.36 | 0.36 | 0.42 | 0.36 | 0.16 | 0.26 | 0.33 |
| $n_d$ | 1.89 | 1.85 | 1.89 | 1.87 | 1.93 | 1.93 | 1.88 |
| Tg(° C.) | 452 | 457 | 453 | 460 | 439 | 451 | 463 |
| $\alpha(\times 10^{-7}/°$ C.) | 88 | 85 | 87 | 83 | 85 | 84 | 82 |
| Ts(° C.) | 540 | 546 | 541 | 550 | 526 | 546 | 555 |
| Tc(° C.) | — | 637 | 619 | 651 | — | — | — |
| Tc − Ts(° C.) | — | 91 | 78 | 101 | — | — | — |
| Height of peak of Tc(μV) | — | 5 | 25 | 4 | — | — | — |
| Devitrification in manufacturing of bulk | ○ | ○ | ○ | ○ | ○ | ○ | ○ |
| Devitrification in manufacturing of flake | ○ | ○ | ○ | ○ | ○ | ○ | ○ |
| Crystallization in frit firing | ○ | ○ | ○ | ○ | ○ | ○ | ○ |

TABLE 2

|  | Ex. 8 | Ex. 9 | Ex. 10 | Ex. 11 | Ex. 12 | Ex. 13 | Ex. 14 |
|---|---|---|---|---|---|---|---|
| $P_2O_5$(mol %) | 12.2 | 7.4 | 7.4 | 6.9 | 7.1 | 6.9 | 7.0 |
| $B_2O_3$(mol %) | 35.4 | 40.2 | 45.0 | 32.9 | 34.1 | 37.6 | 38.1 |
| ZnO(mol %) | 32.4 | 32.4 | 27.6 | 34.6 | 35.8 | 30.3 | 30.7 |
| $Bi_2O_3$(mol %) | 20.0 | 20.0 | 20.0 | 18.6 | 19.3 | 18.7 | 24.2 |
| $TiO_2$(mol %) | — | — | — | — | — | 6.5 | — |
| $WO_3$(mol %) | — | — | — | — | 3.7 | — | — |
| $Li_2O$(mol %) | — | — | — | — | — | — | — |
| $Na_2O$(mol %) | — | — | — | — | — | — | — |
| $K_2O$(mol %) | — | — | — | — | — | — | — |
| SrO(mol %) | — | — | — | 3.5 | — | — | — |
| BaO(mol %) | — | — | — | 3.5 | — | — | — |
| $ZrO_2$(mol %) | — | — | — | — | — | — | — |
| $P_2O_5 + B_2O_3$(mol %) | 47.6 | 47.6 | 52.4 | 39.8 | 41.2 | 44.5 | 45.1 |
| $P_2O_5$(mol %)/ZnO(mol %) | 0.38 | 0.23 | 0.27 | 0.20 | 0.20 | 0.23 | 0.23 |
| $n_d$ | 1.86 | 1.89 | 1.87 | 1.88 | 1.90 | 1.92 | 1.93 |
| Tg(° C.) | 469 | 466 | 472 | 452 | 456 | 474 | 456 |
| $\alpha(\times 10^{-7}/°$ C.) | 83 | 81 | 78 | 89 | 82 | 78 | 90 |
| Ts(° C.) | 559 | 556 | 563 | 545 | 547 | 567 | 545 |
| Tc(° C.) | 650 | — | — | 651 | 624 | 695 | — |
| Tc − Ts(° C.) | 91 | — | — | 106 | 77 | 128 | — |
| Height of peak of Tc(μV) | 23 | — | — | 2 | 23 | 7 | — |
| Devitrification in manufacturing of bulk | ○ | ○ | ○ | ○ | ○ | ○ | ○ |
| Devitrification in manufacturing of flake | ○ | ○ | ○ | ○ | ○ | ○ | ○ |
| Crystallization in frit firing | ○ | ○ | ○ | ○ | ○ | ○ | ○ |

TABLE 3

|  | Ex. 15 | Ex. 16 | Ex. 17 | Ex. 18 | Ex. 19 | Ex. 20 | Ex. 21 |
|---|---|---|---|---|---|---|---|
| $P_2O_5$(mol %) | 2.6 | 2.6 | — | — | — | — | — |
| $B_2O_3$(mol %) | 40.2 | 45 | 59.4 | 54.6 | 41.0 | 47.6 | 54.6 |
| ZnO(mol %) | 37.2 | 32.4 | 20.6 | 25.4 | 39.0 | 25.4 | 28.9 |
| $Bi_2O_3$(mol %) | 20.0 | 20.0 | 20.0 | 20.0 | 20.0 | 27.0 | 16.5 |
| $TiO_2$(mol %) | — | — | — | — | — | — | — |
| $WO_3$(mol %) | — | — | — | — | — | — | — |
| $Li_2O$(mol %) | — | — | — | — | — | — | — |

TABLE 3-continued

|  | Ex. 15 | Ex. 16 | Ex. 17 | Ex. 18 | Ex. 19 | Ex. 20 | Ex. 21 |
|---|---|---|---|---|---|---|---|
| Na$_2$O(mol %) | — | — | — | — | — | — | — |
| K$_2$O(mol %) | — | — | — | — | — | — | — |
| SrO(mol %) | — | — | — | — | — | — | — |
| BaO(mol %) | — | — | — | — | — | — | — |
| ZrO$_2$(mol %) | — | — | — | — | — | — | — |
| P$_2$O$_5$ + B$_2$O$_3$ (mol %) | 42.8 | 47.6 | 59.4 | 54.6 | 41.0 | 47.6 | 54.6 |
| P$_2$O$_5$(mol %)/ZnO(mol %) | 0.07 | 0.08 | 0 | 0 | 0 | 0 | 0 |
| n$_d$ | 1.92 | 1.90 | 1.87 | 1.89 | 1.93 | 1.98 | 1.86 |
| Tg(° C.) | 455 | 458 | 475 | 472 | 447 | 442 | 481 |
| α(×10$^{-7}$/° C.) | 81 | 79 | 76 | 75 | 81 | 87 | 68 |
| Ts(° C.) | 541 | 546 | 564 | 557 | 534 | 521 | 573 |
| Tc(° C.) | — | — | 762 | — | — | — | — |
| Tc − Ts(° C.) | — | — | 198 | — | — | — | — |
| Height of peak of Tc(μV) | — | — | 14 | — | — | — | — |
| Devitrification in manufacturing of bulk | ◯ | ◯ | ◯ | ◯ | ◯ | ◯ | ◯ |
| Devitrification in manufacturing of flake | ◯ | ◯ | ◯ | ◯ | ◯ | ◯ | ◯ |
| Crystallization in frit firing | ◯ | ◯ | ◯ | ◯ | ◯ | ◯ | ◯ |

TABLE 4

|  | Ex. 22 | Ex. 23 | Ex. 24 | Ex. 25 |
|---|---|---|---|---|
| P$_2$O$_5$(mol %) | — | 30.0 | 26.6 | 13.2 |
| B$_2$O$_3$(mol %) | 46.2 | — | 6.6 | 39.2 |
| ZnO(mol %) | 31.5 | 50.0 | 46.8 | 27.6 |
| Bi$_2$O$_3$(mol %) | 19.4 | 20.0 | 20.0 | 20.0 |
| TiO$_2$(mol %) | — | — | — | — |
| WO$_3$(mol %) | — | — | — | — |
| Li$_2$O(mol %) | — | — | — | — |
| Na$_2$O(mol %) | — | — | — | — |
| K$_2$O(mol %) | — | — | — | — |
| SrO(mol %) | — | — | — | — |
| BaO(mol %) | — | — | — | — |
| ZrO$_2$(mol %) | 2.9 | — | — | — |
| P$_2$O$_5$ + B$_2$O$_3$ (mol %) | 46.2 | 30.0 | 33.2 | 52.4 |
| P$_2$O$_5$(mol %)/ZnO(mol %) | 0 | 0.60 | 0.57 | 0.48 |
| n$_d$ | 1.92 | 1.85 | N/A | N/A |
| Tg(° C.) | 466 | 441 | N/A | N/A |
| α(×10$^{-7}$/° C.) | 76 | 93 | N/A | N/A |
| Ts(° C.) | 552 | 526 | 532 | N/A |
| Tc(° C.) | — | 580 | 582 | N/A |
| Tc−Ts(° C.) | — | 54 | 50 | N/A |
| Height of peak of Tc(μV) | — | 295 | 89 | N/A |
| Devitrification in manufacturing of bulk | ◯ | △ | × | × |
| Devitrification in manufacturing of flake | ◯ | ◯ | ◯ | × |
| Crystallization in frit firing | ◯ | × | × | × |

TABLE 5

|  | Ex. 26 | Ex. 27 | Ex. 28 | Ex. 29 | Ex. 30 | Ex. 31 | Ex. 32 | Ex. 33 | Ex. 34 | Ex. 35 |
|---|---|---|---|---|---|---|---|---|---|---|
| P$_2$O$_5$(mol %) | — | — | — | — | — | — | 4.5 | — | — | — |
| B$_2$O$_3$(mol %) | 53.5 | 51.5 | 43.1 | 34.2 | 34.6 | 32 | 32 | 32 | 32.8 | 47.4 |
| ZnO(mol %) | 15 | 8.6 | 7.4 | 13.7 | 6.3 | 12.8 | 12.8 | 12.8 | 13.1 | 36.9 |
| Bi$_2$O$_3$(mol %) | 31.5 | 36.1 | 30.1 | 28.5 | 28.8 | 26.6 | 26.6 | 26.6 | 27.3 | 10.9 |
| TiO$_2$(mol %) | — | — | — | 14.5 | 8.6 | 4.1 | 4.1 | 4.1 | 4.2 | — |
| WO$_3$(mol %) | — | — | — | — | — | — | — | — | — | — |
| Li$_2$O(mol %) | — | — | — | — | — | — | — | — | — | — |
| Na$_2$O(mol %) | — | — | — | — | — | — | — | — | — | — |
| K$_2$O(mol %) | — | — | — | — | — | — | — | — | — | — |
| MgO(mol %) | — | — | — | — | — | — | — | — | — | — |
| CaO(mol %) | — | — | — | — | — | — | — | — | — | — |
| SrO(mol %) | — | — | — | — | — | — | — | — | — | — |
| BaO(mol %) | — | — | — | — | — | — | — | — | — | — |
| SiO$_2$(mol %) | — | 3.8 | 19.4 | 9.1 | 16.7 | 15.2 | 15.2 | 15.2 | 15.6 | — |
| Al$_2$O$_3$(mol %) | — | — | — | — | 5 | 4.8 | 4.8 | 4.8 | 4.9 | 4.8 |
| ZrO$_2$(mol %) | — | — | — | — | — | 4.5 | — | — | — | — |
| Gd$_2$O$_3$(mol %) | — | — | — | — | — | — | — | 4.5 | 2.1 | — |
| P$_2$O$_5$ + B$_2$O$_3$ (mol %) | 53.5 | 51.5 | 43.1 | 34.2 | 34.6 | 32 | 36.5 | 32 | 32.8 | 47.4 |
| P$_2$O$_5$(mol %)/ZnO(mol %) | 0 | 0 | 0 | 0 | 0 | 0 | 0.35 | 0 | 0 | 0 |
| n$_d$ | 1.99 | 2.03 | 1.95 | 2.04 | 2.00 | 1.98 | 1.93 | 1.98 | 1.98 | 1.81 |
| Tg(° C.) | 439 | 434 | 450 | 459 | 460 | 465 | 467 | 475 | 465 | 494 |
| α(×10$^{-7}$/° C.) | 87 | 90 | 84 | 86 | 82 | 80 | 83 | 81 | 81 | 65 |
| Ts(° C.) | 514 | 511 | 592 | 541 | 549 | 558 | 565 | 571 | 557 | 592 |
| Tc(° C.) | — | — | — | 629 | 643 | — | — | — | — | — |
| Tc − Ts(° C.) | — | — | — | 88 | 94 | — | — | — | — | — |
| Height of peak of Tc(μV) | — | — | — | 25 | 16 | — | — | — | — | — |
| Devitrification in manufacturing of bulk | ◯ | ◯ | ◯ | ◯ | ◯ | ◯ | ◯ | ◯ | ◯ | ◯ |

TABLE 5-continued

|  | Ex. 26 | Ex. 27 | Ex. 28 | Ex. 29 | Ex. 30 | Ex. 31 | Ex. 32 | Ex. 33 | Ex. 34 | Ex. 35 |
|---|---|---|---|---|---|---|---|---|---|---|
| Devitrification in manufacturing of flake | ○ | ○ | ○ | ○ | ○ | ○ | ○ | ○ | ○ | ○ |
| Crystallization in frit firing | ○ | ○ | ○ | ○ | ○ | ○ | ○ | ○ | ○ | ○ |

TABLE 6

|  | Ex. 36 | Ex. 37 | Ex. 38 | Ex. 39 | Ex. 40 | Ex. 41 | Ex. 42 | Ex. 43 | Ex. 44 |
|---|---|---|---|---|---|---|---|---|---|
| $P_2O_5$(mol %) | 2.4 | — | — | — | — | — | — | — | 4.5 |
| $B_2O_3$(mol %) | 32.7 | 30.2 | 34.6 | 45.2 | 45.2 | 45.2 | 45.2 | 40.2 | 37.7 |
| ZnO(mol %) | 13.1 | 12.1 | 13.8 | 30.6 | 30.6 | 30.6 | 30.6 | 42.5 | 11.7 |
| $Bi_2O_3$(mol %) | 27.2 | 25.1 | 28.7 | 15 | 15 | 15 | 15 | 13.3 | 24.3 |
| $TiO_2$(mol %) | 4.2 | 3.9 | 4.4 | — | — | — | — | — | 3.7 |
| $WO_3$(mol %) | — | — | — | — | — | — | — | — | — |
| $Li_2O$(mol %) | — | — | — | — | — | — | — | — | — |
| $Na_2O$(mol %) | — | — | — | — | — | — | — | — | — |
| $K_2O$(mol %) | — | — | — | — | — | — | — | — | — |
| MgO(mol %) | — | — | — | 4.6 | — | — | — | — | — |
| CaO(mol %) | — | — | — | — | 4.6 | — | — | — | — |
| SrO(mol %) | — | — | — | — | — | 4.6 | — | — | — |
| BaO(mol %) | — | — | — | — | — | — | 4.6 | — | — |
| $SiO_2$ mol %) | 15.5 | 14.3 | 14 | 1 | 1 | 1 | 1 | 0.8 | 13.8 |
| $Al_2O_3$(mol %) | 4.9 | 4.5 | — | 3.6 | 3.6 | 3.6 | 3.6 | 3.2 | 4.3 |
| $ZrO_2$(mol %) | — | — | — | — | — | — | — | — | — |
| $Gd_2O_3$(mol %) | — | 9.9 | 4.5 | — | — | — | — | — | — |
| $P_2O_5 + B_2O_3$(mol %) | 35.1 | 30.2 | 34.6 | 45.2 | 45.2 | 45.2 | 45.2 | 40.2 | 42.2 |
| $P_2O_5$(mol %)/ZnO(mol %) | 0.18 | 0 | 0 | 0 | 0 | 0 | 0 | 0 | 0.38 |
| $n_d$ | 1.96 | 2.01 | 2.02 | 1.83 | 1.84 | 1.84 | 1.84 | 1.84 | 1.89 |
| Tg(° C.) | 461 | 494 | 464 | 485 | 481 | 476 | 474 | 476 | 471 |
| α(×$10^{-7}$/° C.) | 82 | 83 | 86 | 71 | 75 | 75 | 76 | 70 | 80 |
| Ts(° C.) | 551 | 592 | 553 | 573 | 570 | 569 | 574 | 568 | 549 |
| Tc(° C.) | — | 718 | — | — | — | — | — | — | — |
| Tc − Ts(° C.) | — | 123 | — | — | — | — | — | — | — |
| Height of peak of Tc(μV) | — | 13 | — | — | — | — | — | — | — |
| Devitrification in manufacturing of bulk | ○ | ○ | ○ | ○ | ○ | ○ | ○ | ○ | ○ |
| Devitrification in manufacturing of flake | ○ | ○ | ○ | ○ | ○ | ○ | ○ | ○ | ○ |
| Crystallization in frit firing | ○ | ○ | ○ | ○ | ○ | ○ | ○ | ○ | ○ |

As can be seen from Tables 1 to 6, the glasses in Examples 1 to 22 and Examples 26 to 44 did not substantially contain lead (PbO or $Pb_3O_4$), $Li_2O$, $Na_2O$ and $K_2O$, had a high refractive index, low-temperature softening property, and low thermal expansion rate, and it is possible to prevent devitrification in manufacturing of the glass or crystallization in frit firing. Further, the glasses in Examples 1 to 22 and Examples 26 to 44 had glass transition points Tg of 500° C. or less and the average linear expansion coefficients α are in the range of $60\times10^{-7} \sim 100\times10^{-7}$/° C., such that it is possible to form a scattering layer by firing the glass on a soda-lime glass substrate.

Experiment 2

Next, a glass fit was obtained by dry-pulverizing flake type of glass having the composition of Example 1 for two hours with a ball mill made of alumina. The mass average particle diameter of the glass frit was about 3 micron. A glass paste was manufactured by kneading the obtained glass frit of 75 g with an organic vehicle of 25 g (obtained by dissolving ethylcellulose of 10 wt % in α-terpineol). The glass paste was uniformly printed at the center potion in a size of 9 $cm^2$ such that the thickness after firing became 30 μm, on a soda-lime glass substrate having a size of 10 cm×10 cm and a thickness of 0.55 mm. The glass paste was dried at 150° C. for 30 minutes, and then the temperature was returned to the room temperature and increased up to 450° C. for 30 minutes, and the resin of the organic vehicle was decomposed and allowed to disappear with the temperature maintained at 450° C. for 30 minutes. Thereafter, the temperature was increased up to 515° C. for 7 minutes and the glass frit was softened with the temperature maintained at 515° C. for 30 minutes. Thereafter, the temperature was dropped to the room temperature for 3 hours and a glass layer having the composition of Example 1 was formed on a soda-lime glass substrate. As a result of a test with naked eyes, separation was not seen on the soda-lime glass substrate and both sides of the glass layer. A crystalline was not seen in the glass layer, as the result of observing the glass layer with a transmission type microscope (ECLIPSE ME600 made by Nikon Corporation). Local unevenness that is factor of a short between the electrodes of an organic LED were not seen.

Further, a glass fit was obtained by dry-pulverizing flake type of glass having the composition of Example 19 for two hours with a ball mill made of alumina. The mass average particle diameter of the glass frit was about 3 micron. A glass paste was manufactured by kneading the obtained glass frit of 75 g with an organic vehicle of 25 g (obtained by dissolving ethylcellulose of 10 wt % in α-terpineol). The glass paste was uniformly printed at the center potion in a size of 9 cm² such that the thickness after firing became 30 μm, on a soda-lime glass substrate having a size of 10 cm×10 cm and a thickness of 0.55 mm. The glass paste was dried at 150° C. for 30 minutes, and then the temperature was returned to the room temperature and increased up to 450° C. for 30 minutes, and the resin of the organic vehicle was decomposed and allowed to disappear with the temperature maintained at 450° C. for 30 minutes. Thereafter, the temperature was increased up to 520° C. for 7 minutes and the glass fit was softened with the temperature maintained at 520° C. for 30 minutes. Thereafter, the temperature was dropped to the room temperature for 3 hours and a glass layer having the composition of Example 1 was formed on a soda-lime glass substrate. As a result of a test with naked eyes, separation was not seen on the soda-lime glass substrate and both sides of the glass layer. A crystalline was not seen in the glass layer, as the result of observing the glass layer with a transmission type microscope (ECLIPSE ME600 made by Nikon Corporation). Local unevenness that is factor of a short between the electrodes of an organic LED were not seen.

Further, a glass frit was obtained by dry-pulverizing flake type of glass having the composition of Example 42 for two hours with a ball mill made of alumina. The mass average particle diameter of the glass fit was 3 micron. A glass paste was manufactured by kneading the obtained glass frit of 75 g with an organic vehicle of 25 g (obtained by dissolving ethylcellulose of 10 wt % in α-terpineol). The glass paste was uniformly printed at the center potion in a size of 9 cm² such that the thickness after firing became 30 μm, on a soda-lime glass substrate having a size of 10 cm×10 cm and a thickness of 0.55 mm. The glass paste was dried at 150° C. for 30 minutes, and then the temperature was returned to the room temperature and decreased up to 450° C. only after 30 minutes, and the resin of the organic vehicle was decomposed and allowed to disappear with the temperature maintained at 450° C. for 30 minutes. Thereafter, the temperature was increased up to 545° C. for 7 minutes and the glass frit was softened with the temperature maintained at 545° C. for 30 minutes. Thereafter, the temperature was dropped to the room temperature for 3 hours and a glass layer having the composition of Example 1 was formed on a soda-lime glass substrate. As a result of a test with naked eyes, separation or bending was not seen on the soda-lime glass substrate and both sides of the glass layer. A crystalline was not seen in the glass layer, as the result of observing the glass layer with a transmission type microscope (ECLIPSE ME600 made by Nikon Corporation).

As described above, the base material glass of the embodiment is attached well to a soda-lime glass substrate and problems, such as crack or crystallization, is not generated, such that it can be seen that the base material glass is suitable for a scattering layer of an organic LED element.

Although the present invention was described in detail with reference to a specific embodiment, it is apparent to hose that the present invention may be changed or modified in various ways without departing from the scope of the present invention.

The present application is based on Japanese Patent Applications No. 2009-238676 filed on Oct. 15, 2009 and No. 2010-105715 filed on Apr. 30, 2010, the disclosure of which is incorporated herein by reference in its entity.

INDUSTRIAL APPLICABILITY

According to the present invention, it is possible to provide glass for a scattering layer of an organic LED element that can satisfy the user's demand for reducing the use amount of lead without being easily crystallized, and an organic LED element using the glass.

DESCRIPTION OF THE REFERENCE NUMERALS AND SIGNS

110 ... Substrate
120 ... Scattering layer
130 ... First electrode
140 ... Organic layer
150 ... Second electrode

The invention claimed is:

1. A glass for a scattering layer of an organic LED element, which contains, in terms of mol % on the basis of oxides, 0~20% of $P_2O_5$, 15~60% of $B_2O_3$, 15~28% of $Bi_2O_3$ and 20~50% of ZnO,
   wherein a value obtained by dividing the content of $P_2O_5$ by the content of ZnO is less than 0.48,
   the sum of the contents of $P_2O_5$ and $B_2O_3$ is 30~60%,
   the content of $P_2O_5$ is 10% or less when the sum of the contents of $P_2O_5$ and $B_2O_3$ exceeds 50%, and
   the glass does not substantially contain lead (PbO or $Pb_3O_4$), $Li_2O$, $Na_2O$ and $K_2O$, except for those contained as impurities.

2. The glass for a scattering layer of an organic LED element according to claim 1, wherein, in terms of mol % on the basis of oxides, the sum of the contents of $TiO_2$ and $WO_3$ is 0~12%, the content of $ZrO_2$ is 0~5%, and the sum of the contents of MgO, CaO, SrO and BaO is 0~10%.

3. The glass for a scattering layer of an organic LED element according to claim 1, wherein a refractive index measured at 25° C. by d line of a He lamp (wavelength of 587.6 nm) is 1.85 or more.

4. The glass for a scattering layer of an organic LED element according to claim 1, wherein the glass has an average linear expansion coefficient at 50° C.~300° C. of $60\times10^{-7}$~$100\times10^{-7}$/° C.

5. The glass for a scattering layer of an organic LED element according to claim 1, wherein, in terms of mol% on the basis of oxides, the content of $P_2O_5$ is 5~20%.

6. The glass for a scattering layer of an organic LED element according to claim 1, wherein the glass does not substantially contain $P_2O_5$, except for $P_2O_5$ as an impurity.

7. An organic LED element sequentially comprising:
   a substrate;
   a scattering layer;
   a first electrode;
   an organic layer; and
   a second electrode,
   wherein the scattering layer comprises a base material and one or more kinds of scattering materials being dispersed in the base material and having a different refractive index from the base material, and
   the base material comprises a glass containing, in terms of mol % on the basis of oxides, 0~20% of $P_2O_5$, 15~60% of $B_2O_3$, 15~28% of $Bi_2O_3$, and 20~50% of ZnO, in which a value obtained by dividing the content of $P_2O_5$ by the content of ZnO is less than 0.48, the sum of the contents of $P_2O_5$ and $B_2O_3$ is 30~60%, the content of $P_2O_5$ is 10% or less when the sum of the contents of $P_2O_5$ and $B_2O_3$ exceeds 50%, and the glass does not substantially contain lead (PbO or $Pb_3O_4$), $Li_2O$, $Na_2O$ and $K_2O$, except for those contained as impurities.

8. A glass for a scattering layer of an organic LED element, which contains, in terms of mol % on the basis of oxides, 0~20% of $P_2O_5$, 15~60% of $B_2O_3$, 10-37% of $Bi_2O_3$, 5~50% of ZnO, 0~20% of $SiO_2$, 0~10% of $Al_2O_3$, 0~5% of $ZrO_2$, 0~10% of $Gd_2O_3$, 0~15% of $TiO_2$, and 0~10% of the total of MgO, CaO, SrO and BaO,     wherein a value obtained by dividing the content of $P_2O_5$ by the content of ZnO is less than 0.48,     the sum of the contents of $P_2O_5$ and $B_2O_3$ is 30~60%,     the content of $P_2O_5$ is 10% or less when the sum of the contents of $P_2O_5$ and $B_2O_3$ exceeds 50%, and     the glass does not substantially contain lead (PbO or $Pb_3O_4$), $Li_2O$, $Na_2O$ and $K_2O$, except for those contained as impurities.

9. The glass for a scattering layer of an organic LED element according to claim 8, wherein, in terms of mol % on the basis of oxides, the content of $P_2O_5$ is 2~20%.

10. The glass for a scattering layer of an organic LED element according to claim 8, wherein, in terms of mol % on the basis of oxides, the content of $Gd_2O_3$ is 2~10%.

11. An organic LED element sequentially comprising:
a substrate;
a scattering layer;
a first electrode;
an organic layer; and
a second electrode, wherein the scattering layer comprises a base material and one or more kinds of scattering materials being dispersed in the base material and having a different refractive index from the base material, and the base material contains, in terms of mol % on the basis of oxides, 0~20% of $P_2O_5$, 15~60% of $B_2O_3$, 10~37% of $Bi_2O_3$, 5~50% of ZnO, 0~20% of $SiO_2$, 0~10% of $Al_2O_3$, 0~5% of $ZrO_2$, 0~10% of $Gd_2O_3$, 0~15% of $TiO_2$ and 0~10% of the total of MgO, CaO, SrO and BaO, in which a value obtained by dividing the content of $P_2O_5$ by the content of ZnO is less than 0.48, the sum of the contents of $P_2O_5$ and $B_2O_3$ is 30~60%, the content of $P_2O_5$ is 10% or less when the sum of the contents of $P_2O_5$ and $B_2O_3$ exceeds 50%, and the base material does not substantially contain lead (PbO or $Pb_3O_4$), $Li_2O$, $Na_2O$ and $K_2O$, except for those contained as impurities.

\* \* \* \* \*